United States Patent
Piasecki

(10) Patent No.: US 7,411,538 B1
(45) Date of Patent: Aug. 12, 2008

(54) SAR ANALOG TO DIGITAL CONVERTER HAVING MULTIPLEXABLE GROUND SENSE PIN

(75) Inventor: Douglas S. Piasecki, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/695,002

(22) Filed: Mar. 31, 2007

(51) Int. Cl.
H03M 1/38 (2006.01)
(52) U.S. Cl. ........................ 341/161; 341/155
(58) Field of Classification Search .......... 341/150–165
See application file for complete search history.

(56) References Cited

U.S. PATENT DOCUMENTS

| | | | |
|---|---|---|---|
| 6,424,276 B1 * | 7/2002 | Munoz et al. ............... | 341/120 |
| 6,950,047 B1 * | 9/2005 | Piasecki et al. ............. | 341/131 |
| 6,956,520 B2 * | 10/2005 | Leung et al. ................ | 341/172 |
| 6,985,101 B2 * | 1/2006 | Leung et al. ................ | 341/172 |
| 7,171,542 B1 * | 1/2007 | Alfano et al. ................ | 712/38 |
| 7,188,199 B2 * | 3/2007 | Leung et al. ................ | 341/141 |
| 7,199,746 B1 * | 4/2007 | Chowdhury et al. ........ | 341/172 |
| 7,271,758 B2 * | 9/2007 | Piasecki et al. ............. | 341/172 |

\* cited by examiner

*Primary Examiner*—Lam T Mai
(74) *Attorney, Agent, or Firm*—Howison & Arnott, L.L.P.

(57) ABSTRACT

A circuit includes a successive approximation register A/D converter for performing analog to digital conversions. The register has a ground pin and a ground sense pin. The ground sense pin is connected to a ground port of the circuit. A multiplexer connects the ground sense pin of the successive approximation register A/D converter to one of a plurality of I/O ports of the circuit package. A switch selectively connects the ground sense pin of the successive approximation register A/D converter to the ground port.

13 Claims, 7 Drawing Sheets

SAR ANALOG TO DIGITAL CONVERTER HAVING MULTIPLEXABLE GROUND SENSE PIN

TECHNICAL FIELD

The present invention relates to successive approximation register Analog-to-Digital (A/D) converters, and more particularly, to successive approximation register A/D converters having a ground sense pin that may be multiplexed between a plurality of I/O pins of a circuit.

CROSS-REFERENCE TO RELATED APPLICATIONS

None.

BACKGROUND

A successive approximation analog-to-digital converter (ADC) has been the mainstay of data acquisition systems for many years. Recent design improvements have extended the sampling frequency of these ADCs into the megahertz region with 18-bit resolution. The basic successive approximation ADC performs conversions on command. In order to process ac signals, SAR ADCs must have an input sample-and-hold device to keep the signal constant during the conversion cycle. On the assertion of a CONVERT START command, the sample-and-hold device is placed in the hold mode, and an internal digital-to-converter (DAC) is set to midscale. A comparator then determines whether the sampled analog value is above or below the DAC output, and the result (bit 1, the most significant bit of the conversion) is stored in the successive approximation register (SAR). The DAC is then set either to ¼ scale or ¾ scale (depending on the value of bit 1), and the comparator makes the decision for bit 2 of the conversion. The result is stored in the register, and the process continues until all of the bit values have been determined. When all the bits have been set, tested, and reset or not as appropriate, the contents of the SAR correspond to the value of the analog input, and the conversion is complete. These bit "tests" form the basis of a serial output version SAR-based ADC. Note that the acronym "SAR" actually stands for Successive Approximation Register (the logic block that controls the conversion process), but is universally accepted as the acronym for the architecture itself.

The DAC portion of the SAR ADC can utilize a resistor ladder that requires laser trimming for accuracy or a switched capacitor DAC. The advantage of the switched capacitor DAC is that the accuracy and linearity is primarily determined by high-accuracy photolithography, which in turn controls the capacitor plate area and the capacitance as well as matching. In addition, small capacitors can be placed in parallel with the main capacitors which can be switched in and out with bit switches under control of autocalibration routines to achieve high accuracy and linearity without the need for thin-film laser trimming. Temperature tracking between the switched capacitors can be better than 1 ppm/° C., thereby offering a high degree of temperature stability. Modern fine-line CMOS processes are ideal for the switched capacitor SAR ADC, and the cost is therefore low.

Each of the capacitors in the switched capacitor DAC has one plate thereof connected to a common node which is connected to one input of a comparator, and the other plate thereof connected to an associated switch that can connect the plate to ground, the analog input voltage, AIN, or a reference voltage, VREF. The In the sample or tracking mode, the analog input voltage, AIN, is constantly charging and discharging the parallel combination of all the capacitors. The hold mode is initiated by opening the switch, thus leaving the sampled analog input voltage on the capacitor array. Typically, the other input of the comparator is connected to ground or a common mode voltage. Some type of auto-zero switch will maintain the inputs at the same voltage until after AIN has been sampled, at which time the common node is allowed to "float" allowing the voltage at common node to move as the bit switches are manipulated. If respective bit switches are all connected to ground, a voltage equal to –AIN appears at the common node. Connecting the bit switch for the most significant bit (MSB) to VREF adds a voltage equal to VREF/2 to –AIN. The comparator then makes the MSB bit decision, i.e., is the common node above the voltage on the reference input to the comparator, and the SAR either leaves MSB bit switch connected to VREF or connects it to ground depending on the comparator output (which is high or low depending on whether the voltage at the common node is negative or positive, respectively).

Most SAR ADCs include both a ground pin and a ground sense pin. The ground pin will normally have some type of ground return current associated therewith as a result of all of the circuitry "sharing" that pin. However, it is desired that the ground sense pin have a zero current output therefrom in order to enable more accurate voltage measurements from the ground sense pin. However, in many circuit packages, the space requirements with respect to ground lines and ground sense lines prevent two separate lines from being provided from the ground sense pin of the SAR and the ground pin of the SAR to separate external I/O pins. Thus, it is often necessary to connect the ground sense pin of the SAR and the ground pin of SAR to a single system ground I/O port through a unified output line. This can cause undesired voltage offsets within the SAR preventing incorrect analog to digital conversions. Thus, a SAR device capable of providing separate ground and ground sense outputs to the I/O ports of an associated circuit package would be greatly desirable.

SUMMARY

The present invention disclosed and claimed herein, in one aspect thereof, comprises a circuit. The circuit includes a successive approximation register A/D converter having a ground pin and a ground sense pin. The ground pin is connected to the ground port of the circuit. A multiplexer connects the ground sense pin of the successive approximation register A/D converter to one of a plurality of I/O ports of the circuit. A switch selectively connects the ground sense pin of the successive approximation register A/D converter to the ground port.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION

Figure 1:
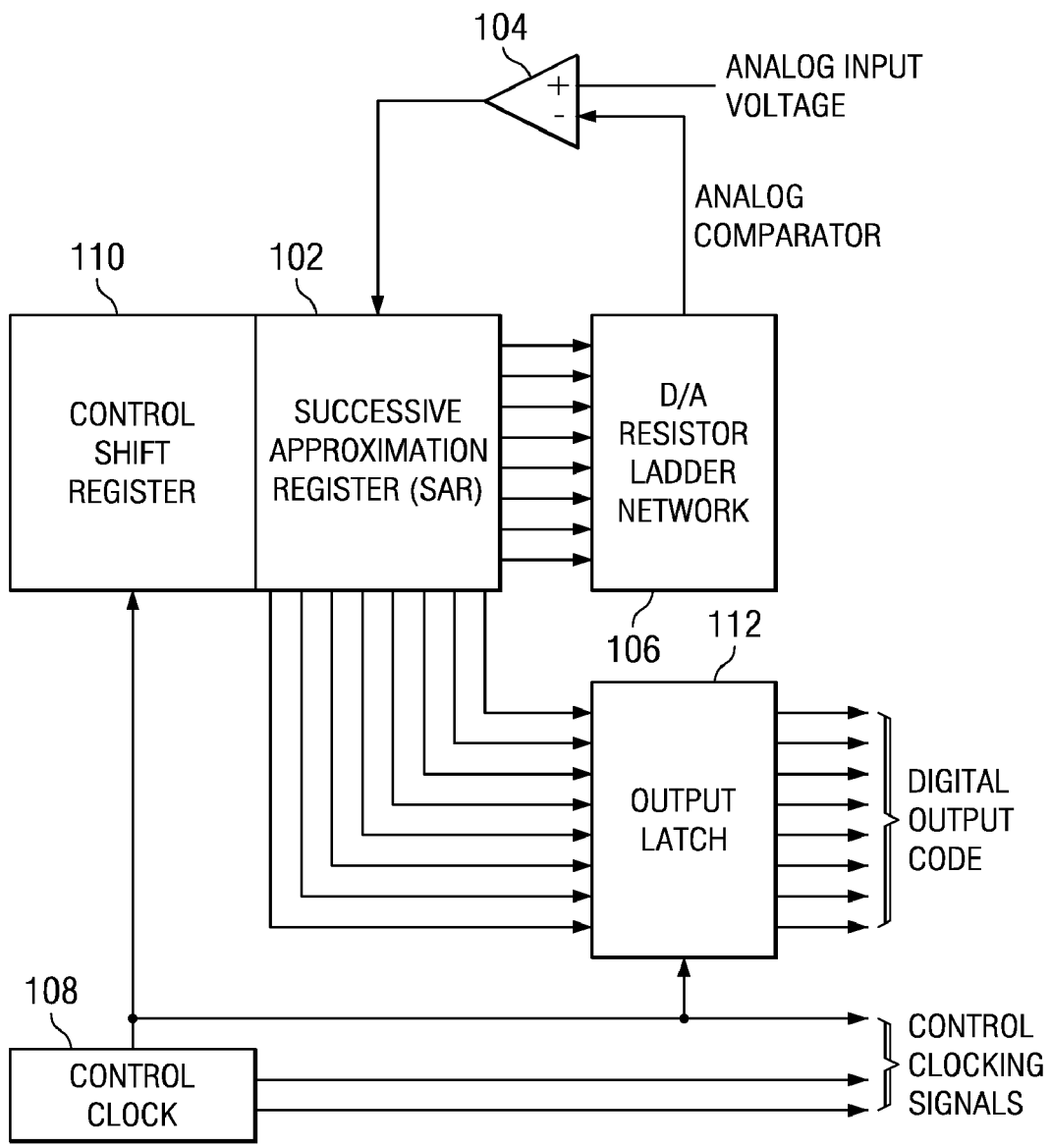
FIG. 1 is a functional block diagram of a successive approximation register A/D converter (SAR)

Referring now to the drawings, wherein like reference numbers are used herein to designate like elements throughout the various views, embodiments of the present invention are illustrated and described, and other possible embodiments of the present invention are described. The figures are not necessarily drawn to scale, and in some instances the drawings have been exaggerated and/or simplified in places for illustrative purposes only. One of ordinary skill in the art will appreciate the many possible applications and variations of the present invention based on the following examples of possible embodiments of the present invention.

Referring now to the drawings, and more particularly to FIG. 1, there is illustrated a functional block diagram of one embodiment of a SAR ADC utilizing a resistor ladder network. Successive approximation A/D conversion is a technique that is commonly used in medium to high speed data acquisition applications. The successive approximation A/D conversion is one of the fastest A/D conversion techniques that requires a minimum amount of circuitry.

The SAR ADC can approximate the analog to digital signal to form an n-bit digital code in n-steps. A successive approximation operation utilizes a successive approximation algorithm (SAR algorithm) to individually compare an analog input voltage to the mid point of one of n ranges to determine the value of one bit. This process is repeated a total n times, using n ranges, to determine the n bits of the code. The comparison is accomplished as follows. The SAR algorithm determines if the analog input is above or below the midpoint and sets the bit of the digital code accordingly. The SAR algorithm then assigns the bits beginning with the most significant bit. The bit is set to "1" if the analog input is greater than the midpoint voltage, or it is set at "0" if it is less than the midpoint voltage. The SAR algorithm then moves to the next bit and sets it as a "1" or a "0" based on the results of comparing the analog input with a midpoint of the next allowed range. Because the SAR algorithm must perform one approximation for each bit in the digital code, an n bit code requires n approximations.

The SAR ADC as illustrated in FIG. 1 consists of four functional blocks, a successive approximation register (SAR) 102, an analog comparator 104, a D/A converter 106 based on a resistor ladder configuration, and a clock 108. Control of the SAR algorithm to the n bit approximation is controlled by a control shift register 110. The output latch 112 latches in the bits of the digital output code as they are determined by the SAR 102 during the conversion cycle. The analog comparator 104 performs the comparisons of an analog input voltage with the midpoint of the selected one of n ranges presently being examined.

Figure 2:
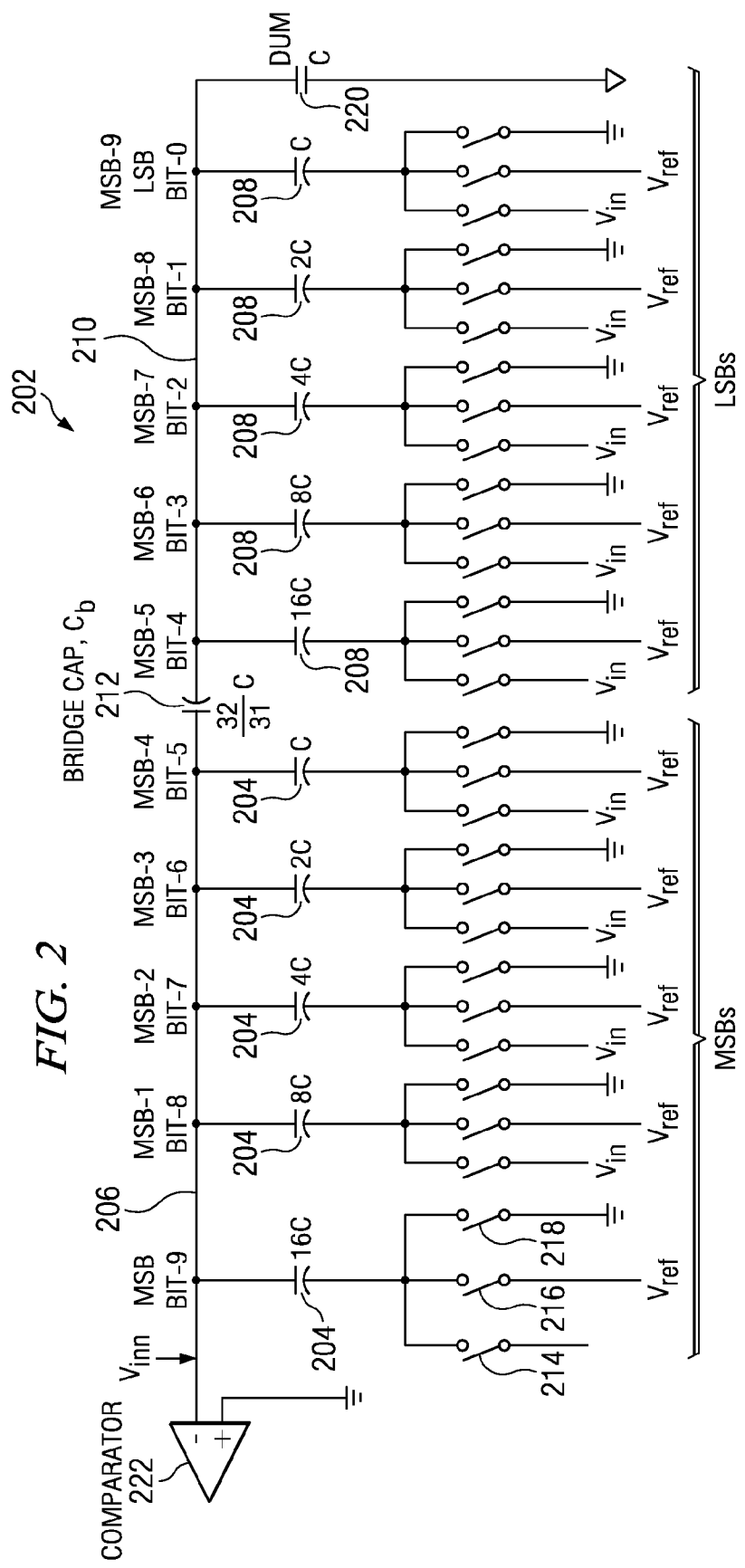
FIG. 2 illustrates a 10 bit split array binary weighted analog digital converter used within a SAR A/D converter.

Referring now to FIG. 2, there is illustrated a 10 bit split array binary weighted analog to digital converter (ADC) utilizing a switched capacitor DAC configuration. The 10 bit split capacitor array binary weighted ADC 202 includes a primary array and a secondary array. The primary array consists of a group of binary weighted switched capacitors 204 connected in parallel wherein a first plate of each capacitor is interconnected at a common node 206 constituting. The secondary array consists of a second group of binary weighted switched capacitors 208 connected in parallel wherein a first plate of each of these capacitors 208 is connected to a second common node 210. The first node 206 and the second node 210 are interconnected via a bridge capacitor 212, this referred to as a bridged capacitor array. The capacitors 204 and 208 are binary weighted capacitors that progressively double in their capacitance from bit 0 to bit 4 and from bit 5 to bit 9. Thus, the capacitance of bit 0 is C, the capacitance of bit 1 is 2C, the capacitance of bit 2 is 4C and so on until the capacitance of the bit 4 is equal to 16C. There is a similar progression in the capacitance from bit 5 to bit 9. The opposite plates of each of the capacitors 204 or 208, which are not connected with common nodes 206 and 210, respectively, are selectively connected to either of an input voltage $V_{in}$ through a respective bit switch 214, a reference voltage $V_{ref}$ through a respective bit switch 216 or ground through a respective bit switch 218. The capacitors connected to common node 206 comprise the most significant bits (MSBs) of the bridged capacitor DAC 202, and the capacitors connected to the node 210 comprise the least significant bits (LSBs). A dummy capacitor 220 connects between node 210 and ground.

Node 206 is connected to a negative input of comparator 222. The positive input of capacitor 222 is connected to ground or some DC common-mode voltage. A change of logical state of the output of comparator 222 indicates that the bit being tested should be logical "1". If the output of the comparator remains constrained the bit being listed is logical "0." The comparator 222 operates in the following manner. After the sampling or tracking is complete, all but the MSB capacitor (Bit-9) is switched to ground, the Bit-9 MSB capacitor 204 is switched to the reference voltage $V_{ref}$, and the input node of the comparator 222 $V_{in}$ settles to the following voltage: $V_{in}=-V_i+0.5*V_{ref}$, where $V_i$ is the analog input voltage (signal). If the input voltage $V_i$ is bigger than one half of the reference voltage $V_{ref}$, then the comparator's output state flips and the decision is made to keep the MSB to the logic high (logic "1") state and its capacitor remains connected to the reference voltage. The next MSB bit (MSB-1 bit), Bit-8, is then tested by switching the lower plate of the associated capacitor from ground to the reference voltage. However, if the comparator's 222 output state does not flip at the end of this test, the bit value is set to logic "0," and the SAR algorithm proceeds by sequentially switching all of the remaining MSB caps from reference to ground.

Figure 3A:
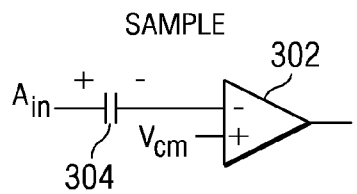
FIGS. 3a through 3c illustrate the configuration of a particular bit of an SAR converter and its associated comparator during the sample, hold and conversion states of the SAR.
Figure 3B:
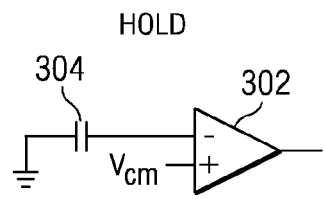
Figure 3C:
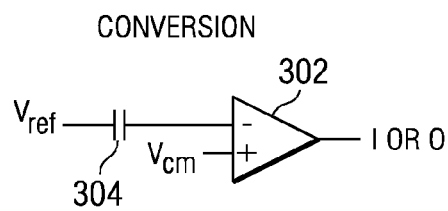

Referring now to FIGS. 3a through 3c there is more fully illustrated the various states of the SAR converter when determining a particular bit using a comparator 302. Initially, as illustrated in FIG. 3a, the comparator 302 has capacitor 304 for a binary weighted capacitor array connected on the upper plate thereof to negative input of comparator 302 (capacitor 304 is the MSB capacitor for the array, the remaining capacitors not illustrated for exemplary purposes). The analog input voltage $A_{in}$ is sampled on the lower or "switched" plate of capacitor 304 in the "sample" or "tracking" mode of operation. The negative input of comparator 302 is initially autozeroed to the voltage on the positive input of comparator 302 prior to or during the tracking mode of operation, such that both voltages are equal. The voltage on the positive input of comparator 302, in many cases, is set at a common mode voltage, $V_{CM}$, or ground.

In the "hold" mode of operation, the switched plate of capacitor 304 is connected to ground, thus pulling the negative input of comparator 302 to a voltage of $V_{CM}-A_{in}$, as the positive input of comparator 302 remains connected to $V_{CM}$, and the logic state of the comparator 302 goes high (logic "1") Referring now finally to FIG. 3c, when the digital value for the bit associated with capacitor 304 is being determined during the "conversion" mode of operation, the switched plate of capacitor 304 is switched to the reference voltage $V_{ref}$ thus disposing the negative input of comparator 302 at a voltage of $V_{CM}-A_{in}+V_{ref}/2$. The output of the comparator 302 will become one or zero depending on whether the analog input voltage $A_{in}$ is larger than one-half the reference voltage $V_{ref}$ (noting the remaining capacitors in the array (not shown) equal the value of the capacitor 304). If $A_{in}$ is larger than one-half $V_{ref}$, the comparator's 302 output state remains at a logic high (logic "1"), indicating that $V_{CM}-A_{in}+V_{ref}/2$ is less than $V_{CM}$. If not, the output of the comparator 302 goes to a logic low level (logic "0"), indicating that $V_{CM}-A_{in}+V_{ref}/2$ is greater than $V_{CM}$. The associated MSB bit is set to the logic level indicated by the output of the comparator 302.

Figure 4:
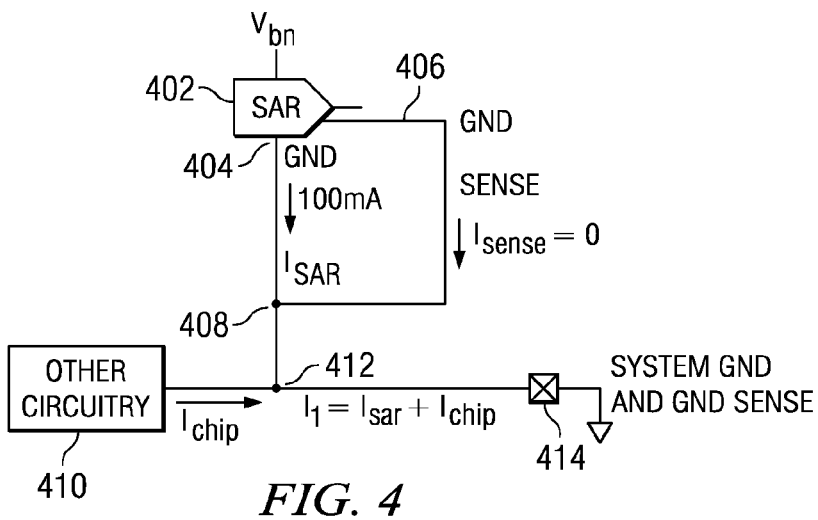
FIG. 4 illustrates the manner in which the ground and ground sense pins of an SAR are shared on a single I/O port.

Referring now to FIG. 4, there is illustrated the implementation of the SAR ADC 402 within a chip package. The SAR ADC 402 includes both a ground node 404 for providing a ground connection to the SAR ADC 402 for accommodating return ground currents for the primary circuitry associated with the SAR operation, and additionally, a ground sense node 406 for connecting to the bit switches that switch the bottom plates of the capacitors between the analog input voltage, ground and the reference voltage. The ground node 404 may provide a ground return current $I_{SAR}$ of approximately 100 microamps. The ground sense node 406, on the other hand, provides an $I_{sense}$ current of zero to enable more accurate measurements of the ground voltage value when connected to the bit switches. However, within many circuit package configurations, the ability to provide separate metal runs for each of the ground node 404 of the SAR ADC 402 and ground sense node of the SAR ADC 402 is not available. Thus, the ground and ground sense nodes will at some point be connected to a single metal run for connection of the ground and ground sense nodes to a single ground port pin 414.

In the illustration of FIG. 4, the ground and ground sense nodes are interconnected at node 408. This will cause the $I_{sense}$ current of zero to be combined with the ground return current $I_{SAR}$ of the SAR ADC 402 at node 408. Additionally, the common line for the SAR ADC ground node 404 and ground sense node 406 may further interconnect with ground return currents of other circuitry 410 within the circuit package at node 412. In this case, a total current provided to a ground I/O pin 414 is equivalent to $I_t=I_{SAR}+I_{chip}+I_{sense}$. This will require that the I/O port 414 act as both as the system ground and as the ground sense pin for the circuit package. Due to the non-zero current from the I/O pin 414 acting as the ground sense pin, various voltage offsets may be induced within the SAR 402 causing the bit conversion offset to be off by a potentially significant factor. This is due to the fact that the sheet resistance between the node 408 and the package pin 414 has a finite value, resulting in an offset voltage existing on the node 408 relative to actual system ground.

Figure 5:
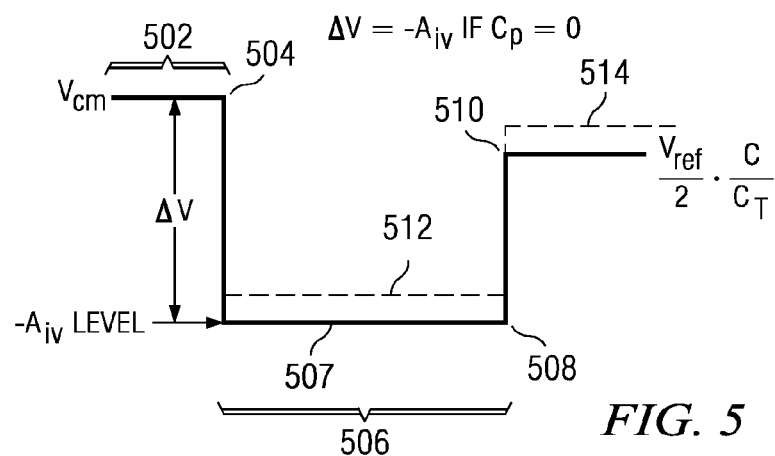
FIG. 5 illustrates the voltage output of the SAR comparator responsive to various conditions.

This is more fully illustrated in FIG. 5. FIG. 5 illustrates the voltage levels at the negative input of the comparator 302 of the SAR 402, this being the common node to which all of the upper non switched plates of the capacitors in the switched capacitors are connected (noting that this is not the case with a bridge configuration where a bridge capacitor separates two or more arrays with separate common nodes). During the sample mode illustrated generally at 502, the voltage on the common node remains at a constant level equivalent to the common mode voltage $V_{CM}$. When the switched plates of all of the capacitors in the binary weighted array are switched to ground at a point 504 there will be a change in voltage at the negative input of the comparator 302 on the common node of $\Delta V$ equivalent to $-A_{in}$ if the parasitic capacitance Cp=zero (the parasitic capacitance is the capacitance that exists between the negative input of the comparator 302 and ground). The voltage on the common node remains at the low level during the hold process indicated generally at step 506 and at a level 507. The MSB bit is then the first bit that is tested at point 508 by connecting the switched plate of the capacitor 304 to a reference voltage $V_{ref}$. This causes the voltage to rise to a level indicated at level 510 which will be the voltage $V_{CM}-A_{in}+V_{ref}/2$. If this voltage level is greater than $V_{CM}$, the output of the comparator 302 will go low indicating that $A_{in}$ is larger than $V_{ref}/2$ and the MSB bit will be set to a value of logic 0." If, however, the voltage $V_{CM}-A_{in}+V_{ref}/2$ is less than $V_{CM}$, the output of the comparator will remain low and the MSB bit is set to a logic "1" and the voltage on the common node will remain at $V_{CM}-A_{in}+V_{ref}/2$. The next approximation step will test the next bit with a switched capacitor value of less one half that of the MSB capacitor and the voltage on the common node will be increased by a value of $V_{ref}/2$, and so on. This is a conventional SAR algorithm operation.

However, when the SAR ADC ground sense node utilizes the same package I/O pin as the SAR ADC ground pin of the SAR ADC 402, the return current of the SAR ADC 402 and the return currents of other circuitry 410 within the circuit package can cause a voltage offset equivalent to the ground return current multiplied by the equivalent resistance of the metal run utilized by the ground node 404 and ground sense node 406. Thus, the voltage on the common node, rather than changing by a value $\Delta V$, will only change to the voltage level 512 indicated generally by the dash line in FIG. 5. This will have the effect during testing of a bit that the voltage that is provided to common node attached to the negative input of the comparator 302, rather than being pulled up to a level 510 from level from the level 507, will be pulled up to a level 514 from the level 512. This can cause a difference in the output logic of the comparator 302 causing a 1-bit to be a 1-bit instead. This can cause a significant difference in the least significant bit of the digital output of the SAR converter.

Figure 6:
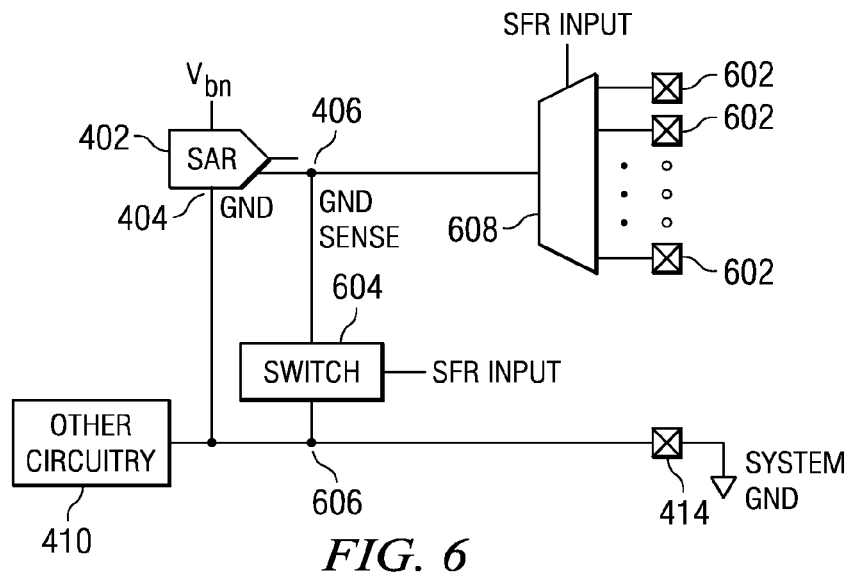
FIG. 6 illustrates a successive approximation register A/D converter having a ground sense pin which may be multiplexed between multiple I/O ports.

Referring now to FIG. 6, there is illustrated the manner in which the ground sense node 406 of the SAR 402 may be multiplexed to one of multiple available I/O pins 602. If no additional I/O pins 602 are available, the switch 604 responsive to an input from a special function register (this is a register that stores configuration information for the packaged device) interconnects the ground sense node 406 and ground node 404 with a common ground at node 606. The ground sense node 406 and ground node 404 share the system ground package pin 414. As the other package circuitry 410 and SAR ADC 402 are providing ground return currents that are mixed with the ground sense signal at node 606, the offset problems described previously with respect to FIG. 5 would be present. However, if additional I/O ports 602 are available, the ground sense node 406 may be connected to its own separate I/O port 602 while the ground node 404 would still remain connected to the package ground pin 414. In this case, the external pin used for the ground sense node 406 would not suffer from the affects of the return current of the SAR 402 and other circuitry 410 and eliminates the offsets described with respect to FIG. 5.

When an external pin 602 is available, the switch 604 disconnects the ground sense pin 406 from node 606 responsive to an input from a special function register. The switch 604 also connects the ground sense pin 406 to the input of a multiplexer 608. The multiplexer 608 is responsive to an input from a special function register to multiplex the output of the ground sense node 406 to an available I/O package pin 602 connected to the output of the multiplexer 608. The multiplexer 608 multiplexes the output of the ground sense node 406 of the SAR 402 to whichever I/O package pin 602 is available. By utilizing a separate I/O package pin 602 the voltage offset problems described previously herein would not be impressed upon the common mode voltage of the SAR 402.

The I/O package pins 602 may be configured to operate in either an analog or digital mode utilizing the configuration described hereinbelow with respect to FIGS. 8 through 11. While the following description provides only one example of a manner in which I/O pins may be configured to operate in a variety of modes, other implementations are applicable.

In a further embodiment, the path between the multiplexer 608 and an I/O pin 602 may also include an offset correction established for example by an internal current DAC and resistor. In this way if a component having its ground sense pin inherently causes an undesired voltage offset, the multiplexer may route the ground sense pin in a manner that introduces an offset correction factor to remove any undesired offset.

Figure 7:
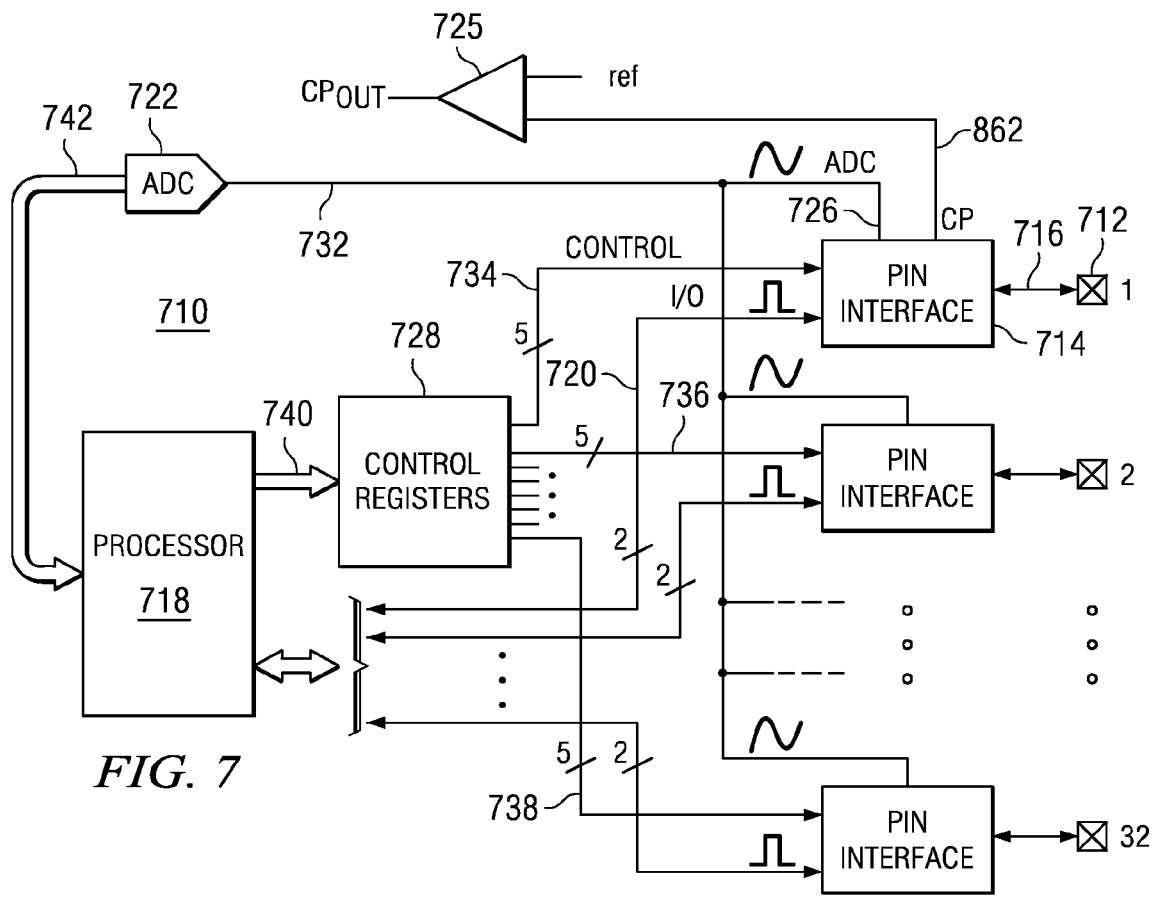
FIG. 7 illustrates a generalized diagram of digital and analog circuits, and the control signals for controlling an I/O pin interface circuit.

With reference now to FIG. 7, there is illustrated the various analog and digital circuits involved in the described embodiment that utilize many of the analog/digital pin interface circuits and corresponding contact pads of the integrated circuit 710. The integrated circuit 710 includes a number of contact pads or connection pins, designated numerically from one to thirty-two. Although only thirty-two I/O pins are illustrated, the invention can be adapted to any circuit irrespective of the number of I/O pins. Each pin, for example, Pin1 is coupled to a pin interface 714. The pin interface 714 couples analog or digital signals to or from the I/O contact pad 712 on conductor 716. The pin interface 714 can couple digital signals to digital circuits, such as a processor 718 on one conductor of a two-wire path 720, or receive digital signals therefrom on the other conductor of the two-wire path 720. The pin interface 714 can also couple analog signals to analog circuits, such as an analog-to-digital converter 722, by way of a common analog line 732. Those skilled in the art may also find it advantageous to couple the common analog line 732 to other types of analog processing circuits, such as analog wave shaping circuits, comparators, amplifiers, etc. The externally-generated analog signals received from the pin interface 714 are coupled via a transmission gate in the pin interface on analog line 726. The analog signals coupled to the pin interface 714 can also be coupled on line 862 to a comparator 725 for comparison with either a fixed or programmable reference voltage. Other analog monitor circuits can also be utilized.

The analog transmission gate in each pin interface circuit is controlled by a respective control line connected to a control register circuit 728. The analog output of each such analog transmission gate is wire-OR'd together to form the common analog line 732. The overall function of the transmission gates in the respective pin interface is to provide a 32:1 multiplexer. The processor 718 controls the logic states of the registers in the circuit 728 to select which one of the thirty two analog transmission gates will be active to couple the associated analog signal to the ADC 722. While FIG. 7 illustrates in principle the distributed nature of the analog transmission gate multiplexer, other unified multiplexers could be utilized. In addition, those skilled in the art may prefer to employ different multiplexer arrangements, such as 32:2 type multiplexers, and others.

Each of the other pin interface circuits are interconnected and operate in the same manner for coupling digital signals between the respective contact pads and the processor 718, or for coupling analog signals between the contact pads and the ADC 722 and/or comparator 725. Each pin interface circuit is controlled as to whether the operation thereof will be digital or analog; using control signals output by control registers 728. The control registers 728 provide a number of outputs for controlling distributed analog multiplexing circuits in the pin interfaces. In the example, since there are thirty-two pin interface circuits with corresponding contact pads, the control register circuit 728 provides thirty-two separate control signals for individually controlling the multiplexing circuits in each pin interface. The control register circuit 728 also provides other control signals for controlling the pin interfaces. For example, on the five control register outputs 734, the various circuits of the first pin interface 714 are controlled. Control register outputs 736 control the circuits in the second pin interface, and so on in a similar manner. Lastly, the pin interface associated with pin 732 is controlled by signals on control register lines 738.

The various circuits of the integrated circuit 710 shown in FIG. 7 operate in the following manner. When it is desired to configure a pin interface for receiving digital signals and driving the same on the respective contact pads, the following operations are carried out. The processor 718 is programmed to configure the pin interfaces in various modes. When it is desired to configure the pins for driving digital signals, control signals are generated by the processor 718 and coupled on bus 740 to the control registers 728. The control registers 728 latch the control signals therein and provide steady state control signals to the various pin interface circuits to be controlled. In order to configure the first pin interface 714 for driving digital signals, a control signal is placed on one conductor of control line 734 to configure the first pin interface 714 into a mode for driving digital signals to the I/O contact pad 712. The processor 718, then transmits digital signals on one line of the 2-wire bus 720 directed to the first pin interface 714. The pin interface 714 then drives such digital signals on conductor 716 to the I/O contact pad 712.

When it is desired to configure the pin interface 714 in a mode for receiving externally-generated digital signals from the I/O contact pad 712, appropriate control signals are generated by the processor 718 and transferred to the control registers 728 on bus 740. The control signals on line 734 will be maintained for the digital operating mode, but the processor 718 will reconfigure itself so as to receive digital signals from the pin interface 714 on the other conductor of the 2-wire bus 720. In this manner, digital signals are coupled externally to the I/O contact pad 712, and therefrom to the processor 718 via the pin interface 714. The remaining pin interface circuits function in the same manner.

When it is desired to configure the pin interfaces, such as the first pin interface 714 for operating in an analog mode, the processor 718 writes the appropriate control registers 728 to provide different control signals on the control lines 734. When configured for analog operation, the pin interface 714 receives externally-generated analog signals from the I/O contact pad 712 and couples the same via an internal transmission gate on analog line 726 to the common analog line 732. When configured for analog operation, the control registers 728 are also written to produce appropriate logic states on the bus 734, whereupon the internal analog transmission gate is enabled. The analog line 726 is thus selected for coupling the analog signals thereon through the transmission gate to the common analog output line 732. Analog signals can thus be coupled from the I/O contact pad 712 through the pin interface 714 to the analog-to-digital converter 722. When the ADC 722 converts the analog signals to corresponding digital signals, such digital signals can be coupled on the bus 742 to many other digital circuits, including the processor 718. The digital signals on bus 742 can then be processed by the processor 718 and the result thereof transmitted back to the pin interfaces during a digital mode of operation.

As noted above, the analog signals can also be coupled from the pin interface 714 to the comparator 725 for comparison with a predefined or programmable reference voltage. If all the analog lines of each pin interface are to be used for comparison with a reference voltage, the common analog line 732 can be connected to the input of the comparator 725.

While the pin interface 714 is illustrated in FIG. 7 as being configured so as to provide for the input of analog signals, the output of analog signals can also be achieved. In providing a bi-directional flow of analog signals with regard to the pin interface 714, the pin interface transmission gate can be controlled to allow externally-generated analog signals to not only be input to the pin interface 714, but also allow internally-generated analog signals to be output therefrom as well. With this alternate arrangement, on-board analog signal generating circuits can be coupled through an analog selector or multiplexing arrangement to the common analog bus 732, for transferring the analog signals to the various pin interfaces.

Figure 8:
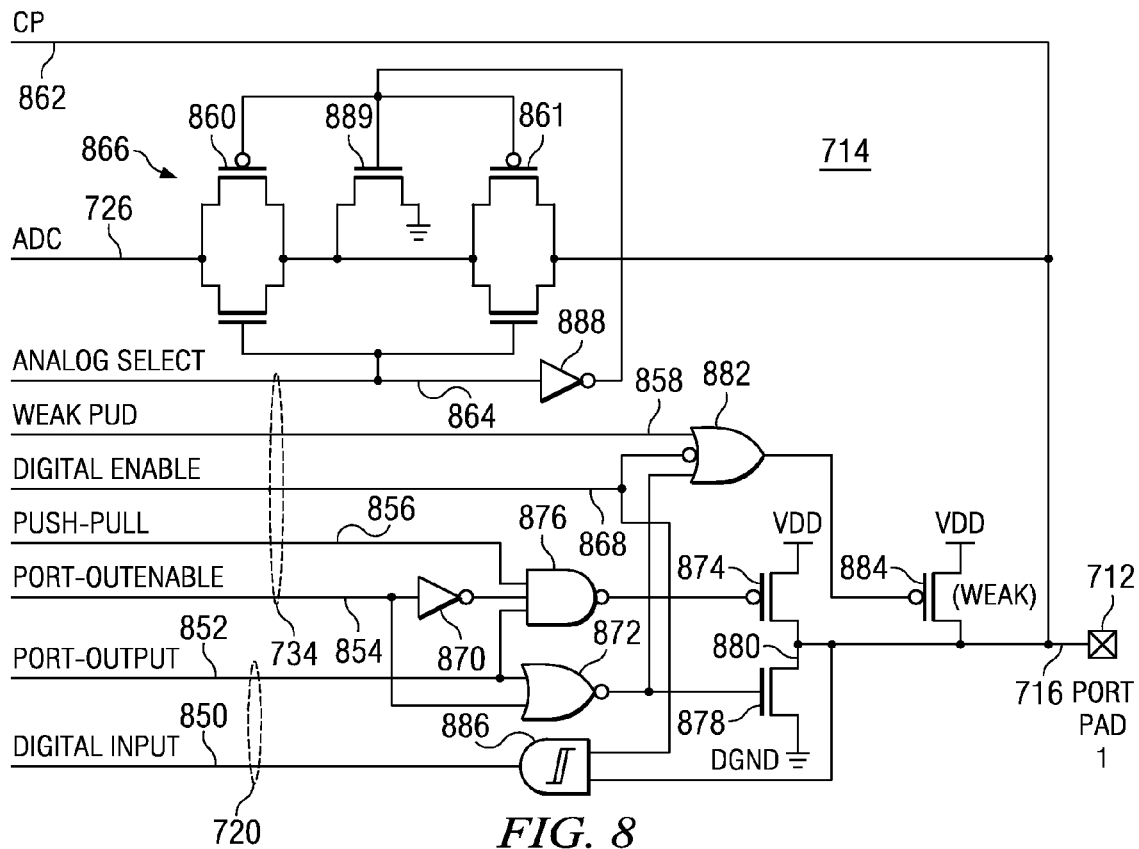
FIG. 8 illustrates the details of an I/O pin interface circuit according to the described embodiment.

Reference is now made to FIG. 8 where there is shown in functional detail only one pin interface circuit 714. The other pin interface circuits are constructed and operate in an identical manner. While the various logic functions carried out by the pin interface circuit are shown as implemented by traditional logic gates, in practice such functions are carried out by various types of transistor circuits which perform the logic functions. Those skilled in the art can readily devise many different types of transistor circuits to carry out the noted logic functions. Many of the signals coupled to the pin interface circuit 714 are generated by the microprocessor 718. In the preferred embodiment, a triplet of the signals is coupled to each pin interface circuit by way of a priority cross-bar decoder. The cross-bar decoder circuit is described in detail in pending applications of the assignee identified as U.S. application Ser. No. 09/584,308 filed May 31, 2000 and application Ser. No. 09/583,260 filed May 31, 2000, the subject matter of such applications being incorporated herein by reference. In view that a cross-bar decoder is not essential to the operation of the present invention, such circuit will not be described here. Rather, it is sufficient to understand that the pin interface circuit 714 of the invention need only be coupled either directly or indirectly to analog and digital circuits, and controlled accordingly by suitable control circuits.

The relevant signals shown in connection with the pin interface circuit 714 of FIG. 8 function in the following manner. The Digital Input signals carried on line 850 constitute the digital signals coupled from the I/O contact pad 712 to the digital circuits 718 of the integrated circuit 710. The signals carried on the Port-Output line 852 are the digital signals coupled from the digital circuits 718 of the integrated circuit 710 to the I/O contact pad 712. Lines 850 and 852 constitute the two-wire bus conductor 720 shown in FIG. 7. The Port-Outenable line 854 carries the control signals generated by the processor 718, or support circuits therefor, for enabling and disabling operation of the pin interface circuit 714. In particular, when the Port-Outenable signal on line 854 is driven by the multiprocessor 718 to a logic low state, the pin interface circuit 714 is operative to allow digital signals to be output to the I/O contact pad 712. When at a logic high state, the Port-Outenable line 854 causes the conductor 716 coupling the pin interface circuit 714 to the contact pad 712, to be driven to a high impedance state. The Push-Pull line 856 carries signals which allow a push-pull driver of the pin interface circuit 714 to be operational. The Weak Pud signal on line 858 controls the operation of a weak pull-up transistor coupled to the conductor 716. The ADC signal on line 726 is the analog signal carried from the I/O contact pad 712 to the common analog line 732 of FIG. 1. Control lines 854, 856, 858, 864, and 868 of FIG. 8 constitute the five-wire bus conductor 734 shown in FIG. 7.

The CP signal on line 862 can be coupled to the comparator 725 shown in FIG. 7. The processor 718 can cause digital or analog signals carried on the conductor 716 to be coupled to the comparator 725 for comparison with a reference voltage that is programmable to different amplitudes. While only pin interface circuit 714 is shown equipped with the capability of being coupled to the comparator 725, one or more of the other pin interface circuits can be designed to provide a similar function.

The Analog Select signal on control line 864 controls an analog transmission gate circuit 866 to allow the coupling of externally-generated analog signals input to the I/O contact pad 712 to analog signal processing circuits. In practice, the analog transmission gate circuit 866 is a pair of series-connected analog transmission gates 860 and 861, which if enabled, allows analog signals to pass therethrough in either direction. Each transmission gate 860 and 861 each constitutes a P-channel and N-channel transistor. The Analog Select control signal on line 864 drives the N-channel transistors, and such control signal drives the P-channel transistors by way of an inverter 888. If the transmission gate 866 is not enabled, the connection between the individual transmission gates is pulled to a ground potential by transistor 889, thereby isolating the unused terminals which may otherwise have digital signals, noise, cross-talk or other signals imposed thereon. This is an important feature of the pin interface 714 because it enables the multiplexer to select or to isolate the analog signal at the I/O contact pad 712 or pin location. Otherwise, thirty-two analog signals would have to be routed to a multiplexer cell located external to the pin interfaces. With this invention, only one analog route, (or fewer than thirty-two routes depending on the manner in which external multiplexers 724 are configured, see FIG. 10), is connected to all of the pin interfaces being multiplexed onto the common analog line 732. This enables the pin interfaces to be distributed more ubiquitously about the perimeter or area of the semiconductor chip (or PCB).

The Digital Enable signal on control line 868 disables the weak pull-up transistor 884 and the logic gate 886 during analog operation. Automatic disabling of the weak pull-up transistor 884 is optional. In the operation of the pin interface circuit 714 of FIG. 8, a logic high state of the Port-Outenable signal on line 854 is coupled through an inverter 870 to present a logic low state on an input of NAND gate 876. The output of the NAND gate 876 is a logic high which drives a P-channel transistor 874 of a push-pull driver, thereby turning it off. The Port-Outenable signal on line 854 also drives an input of a NOR gate 872 in the pin interface circuit 714. The output of the NOR gate 872 drives an N-channel driver transistor 878 of the push-pull driver to a low level, thereby turning it off. As a result, push-pull output 880 of the driver transistors 874 and 878 is placed in a high impedance state, which state is coupled to the corresponding I/O contact pad 712 via conductor 716. Thus, when the Port-Outenable signal is at a logic high state, the I/O contact pad 712 is driven to a high impedance state. This feature can be advantageously used when it is desired to place an I/O pin of the integrated circuit 710 in an input mode. The tristate condition of the driver can also be used when the signals of the integrated circuit 710 are "settling" to a stable state. This prevents temporary-state transitions and glitches from appearing at the I/O contact pad. Also, when the Port-Outenable signal is high during this transition period, no erroneous signals will appear at the I/O contact pad 712. Those skilled in the art may also utilize additional circuits connected to the P-channel driver transistor 874 and the N-channel driver transistor 878 to prevent both such transistors from being driven into conduction at the same time. Moreover, those skilled in the art may find that not all pin interface circuits should be driven into a high impedance state at the same time. To that end, different control lines in lieu of line 854 can be coupled to the pin interfaces.

With reference again to the I/O pin interface circuit 714, it is noted that if the driver is configured to an operational state in which the logic state on line 854 is at a low state, the I/O contact pad 712 can be driven to the logic state corresponding to the data on the Port-Output line 852. As noted in FIG. 8, the Port-Output signal on line 852 is coupled to an input of the NOR gate 872, as well as to an input of the NAND gate 876. For purposes of example, it is assumed that the driver transistors 874 and 878 are to be operated in a push-pull manner.

Accordingly, the Push-Pull control line 856 is driven by the microprocessor 718 to a logic high level. Assuming further that the logic state on the Port-Output line 852 is driven to a logic high, then the output of the NOR gate 872 will be logic low, thereby turning off the N-channel driver transistor 878. On the other hand, the output of the NAND gate 876 will be at a logic low level, thereby driving the P-channel driver transistor 874 into conduction. The I/O contact pad 712 will thus be driven to a logic high state, corresponding to the logic high state on the Port-Output line 852. Digital data can thus be coupled from the Port-Output line 852 to the I/O contact pad 712.

If, on the other hand, the logic state of the digital data on the Port-Output line 852 is at a logic low state, then the output of the NOR gate 872 will be logic high state. The output of the NAND gate 876 will be at a logic high state also. The P-channel driver transistor 874 will thus be turned off, while the N-channel driver transistor 878 of the push-pull pair will be driven into conduction. The logic state of the I/O contact pad 712 is thus a logic low, corresponding to the logic low state on the Port-Output line 852.

In the event that the I/O contact pad 712 is to be provided with a weak pull-up, then the control line 858 is driven to a logic low state. If the output of the NOR gate 872 is also at a logic low state, the OR gate 882 will bias the P-channel driver transistor 884 into conduction. The weak pull-up transistor 884 is constructed with a long conduction channel, thereby providing a high resistance between the supply voltage VDD and the I/O contact pad 712. A weak pull-up to the I/O contact pad 712 is thus provided. A separate weak pull-up control line is coupled to each of the pin interface circuits, and such lines are controlled by way of the control registers 728. In like manner, each pin interface circuit is controlled by a separate Push-Pull control signal line, one shown as reference number 856. The push-pull control lines are also controlled by the control registers 728.

In order to configure the I/O contact pad 712 for the input of digital signals, the Port-Outenable signal on line 854 is driven to a logic high state. As noted above, both push-pull transistors 874 and 878 are turned off, thereby placing the I/O contact pad 712 in a high impedance state. Accordingly, external analog and digital signals can be applied to the I/O contact pad 712. The input digital signals on I/O contact pad 712 are coupled via the conductor 716 to an input of AND gate 886 and therethrough to Digital Input line 850. With reference to FIG. 7, the input data signals on line 850 of bus 720 can be coupled to the microprocessor 718 or other digital circuits.

As noted above, when the I/O contact pad 712 is utilized for the input or output of digital signals, the Digital Enable signal on control line 868 is driven to a logic high level. The logic high input to the two-input AND gate 886 allows digital signals to be passed from the I/O contact pad 712 to the microprocessor 718. Also, the logic high state of the Digital Enable signal places an enabling signal on the inverting input of the OR gate 882, thereby enabling operation of the Weak Pull-up transistor 884, if the Weak PUD signal on line 858 is asserted. As can be appreciated, the foregoing represents an OR function in controlling the weak pull-up transistor 884.

When it is desired to configure the I/O contact pad 712 for receiving analog signals, the Port-Outenable control signal on line 854 is driven to a logic high state, thereby placing the push-pull transistors 874 and 878 in a high impedance state. Additionally, the Digital Enable signal on control line 868 is driven to a logic low. This disables the weak pull-up transistor 884 via the OR gate 882, and disables the AND gate 886. It is important to disable the logic gates having inputs coupled to the I/O contact pad conductor 716, otherwise the analog voltages may not only drive the logic gates to different states, but may also activate push-pull transistors in such gates so that current flows therethrough. In other words, analog voltage levels may be encountered on the I/O contact pad 712 that will not drive the logic gates to either a logic high or low state, but rather drive such gates to an indeterminate logic state. Such indeterminate logic states can often cause unnecessary current flow therein, which is wasteful of power in the integrated circuit. Various types of logic gates may include additional protection circuits to prevent large current flow therethrough when driven by a signal with an indeterminate logic state. When utilizing such type of logic circuits, the AND gate 886 may not be required to be disabled during analog operation.

In any event, when the pin interface circuit 714 is configured for analog operation, the Analog Select signal on control line 864 is driven to a logic high state, thereby allowing signals to be passed through the analog transmission gate circuit 866. As noted above, each pin interface circuit includes a transmission gate circuit which is part of a distributed multiplexer. Analog signals can thus pass unimpeded from the I/O contact pad 712 to the analog-to-digital converter 722. When it is desired to convert the analog signals coupled to I/O contact pad 712 to corresponding digital signals, the appropriate control signals are generated by the microprocessor 718, are latched in the control register 728, and are coupled to the pin interface circuits. In the embodiment shown in FIGS. 7 and 8, only one pin interface circuit is enabled for analog operation at a time. The pin interface circuit enabled for analog operation will couple the analog signals coupled thereto to the common analog line 732 via the analog transmission gate circuit in the enabled pin interface circuit. In the other pin interface circuits disabled for analog operation, the isolated transistor 889 in the respective analog transmission gate circuits will be driven into conduction, thereby providing electrical isolation between the common analog line 732 and the circuits of the disabled pin interface circuits. The microprocessor 718 can also control the ADC circuit 722 to commence conversion of the analog signal to a corresponding digital word.

As noted in FIGS. 7 and 8, the input of the comparator 725 is also coupled to the I/O contact pad 712 connected to the pin interface 714. Either analog signal levels or digital signal levels can be compared with a reference voltage to verify acceptable circuit operation. Indeed, the microprocessor 718 can drive the I/O contact pad 712 with a logic level, and verify with the comparator 725 that such level is within specified limits. The comparison operation can be carried out by increasing (or decreasing) the variable reference voltage until the output of the comparator changes state. The voltage magnitude of the signal on the I/O contact pad 712 can thus be determined.

As an alternative, a signal coupled to the I/O contact pad 712, whether it be a digital input/output or analog signal, may be routed through the respective analog transmission gate circuit 866 as previously described, and measured directly by the ADC 722 using N bits of resolution. This feature of the present invention adds to the capabilities of the commonly known SCAN testing method. With SCAN chain testing, there is provided the ability to test the digital I/O signals coupled to the integrated circuit. This invention in one of its embodiments may be extended to add analog level sensitivity testing to the scan chain by using the comparator 725 or ADC 722 as described above, to measure the signal amplitude on the I/O contact pad 712 and provide a pass or fail condition as appropriately determined by the scan chain.

Figure 9:
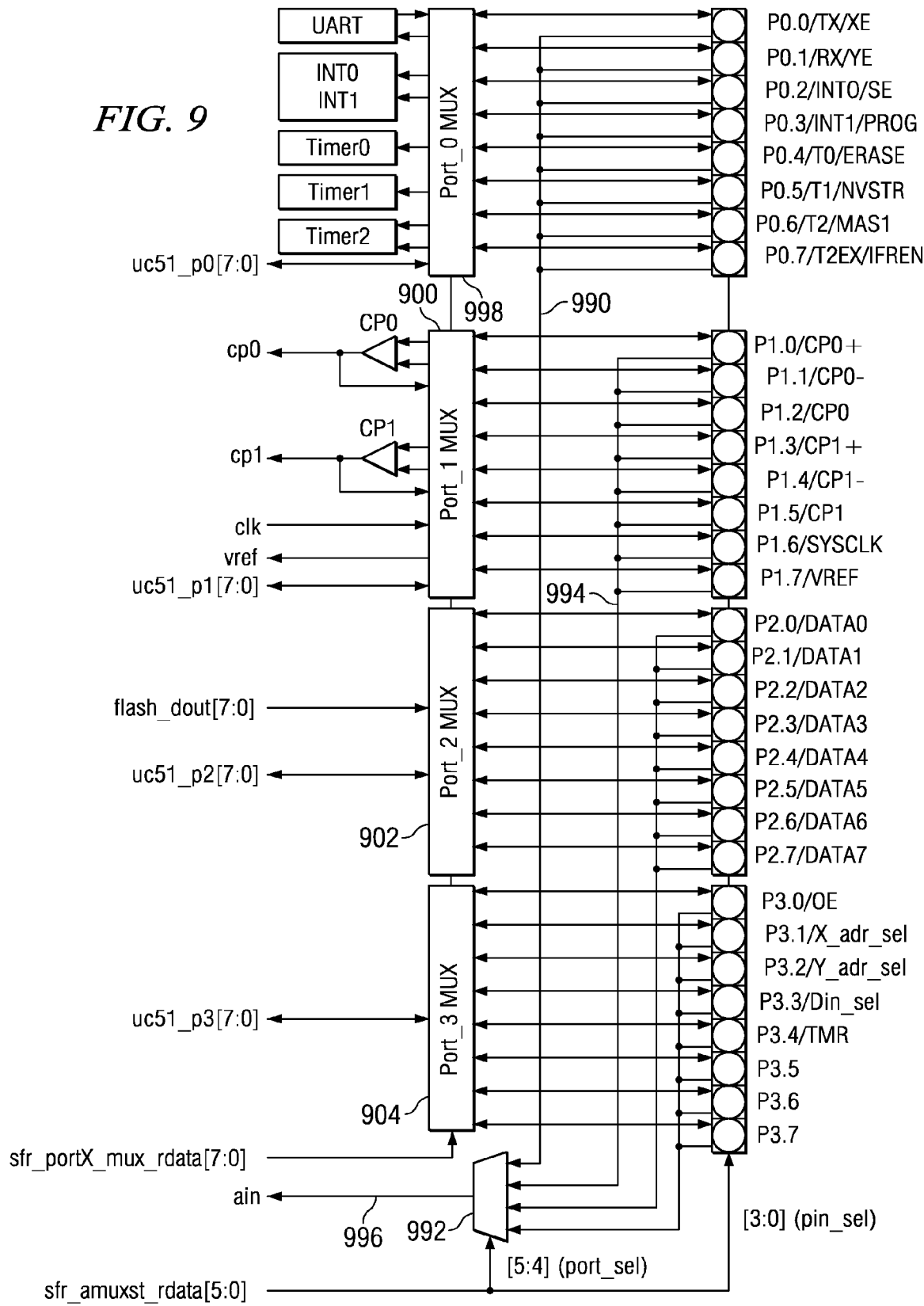
FIG. 9 illustrates in a detailed manner how the analog lines from the pin interface circuits are multiplexed together.

With reference now to FIG. 9, there is illustrated an embodiment of the disclosed I/O pin configuration, showing the manner in which the digital and analog lines of each pin interface are connected to the respective support circuits. Shown are four ports, each having eight I/O contact pads, totaling thirty-two I/O contact pads for the integrated circuit

710. The designation, for example P1.6/SYSCLK, identifies port 1 of the four ports, and pin 6 of that port. The pneumonic identifier indicates that the system clock signal can be multiplexed onto the port pin. In contrast with the embodiment shown in FIG. 7, where each analog conductor of the thirty two pin interface circuits is connected to a common analog line 732, single multiplexer 724, the multiplexing arrangement shown in FIG. 9 is different. In the FIG. 9 embodiment, the analog lines of each port interface driver in a group are connected together to provide a common analog line for the group. In other words, each of the eight pin interface circuits of port 0 are coupled together, and extended by a common analog line 990 to one input of a four-input multiplexer 992. The eight analog lines of port 1 are similarly connected together, and extended as a second common analog line 994 to a second input of the multiplexer 992. The analog lines of the port 2 and port 3 groups of pin interfaces are similarly connected and coupled as respective third and fourth common analog lines to the remaining two inputs of the multiplexer 992. The multiplexer 992 requires only two digital signals for decoding in order to select one of the four analog inputs for coupling signals on the selected common analog line to the output 996 of the multiplexer 992. With this arrangement, fewer conductors are required to be extended between the port interface driver circuits and the multiplexer 992. While not specifically shown, each group of port interface driver circuits requires an analog select decoder for decoding a 3-bit digital word to select one of the analog select signals 864 of each group. With this arrangement, even if multiple port I/O contact pads are driven by analog signals, the operation of only one analog transmission gate circuit 866 (FIG. 8) ensures that only single analog signal is coupled from that group on the common analog line to the multiplexer 992. As can be appreciated, even though a multiplexer 992 external to the port interface driver circuits is utilize, the distributed multiplexer employing the analog transmission gate circuits 866 is nevertheless used in each pin interface circuit.

As further shown in FIG. 9, there are additional multiplexers 998-904 for multiplexing the digital signals with regard to the various pin interface groups, and port I/O contact pads.

Figure 10:
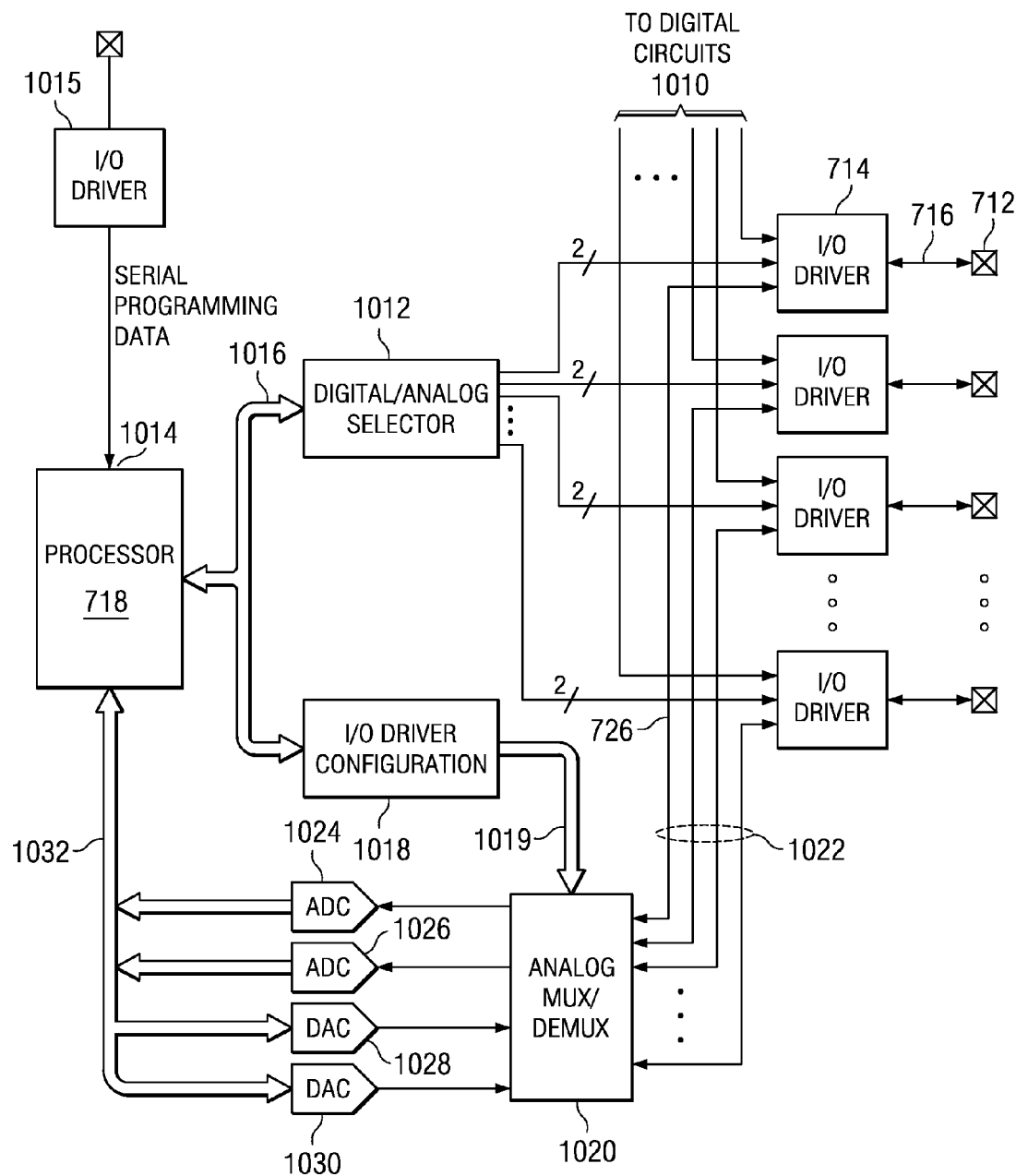
FIG. 10 illustrates in block diagram form an embodiment for multiplexing analog signals between the I/O pin interface circuits and an onboard ADC/DAC devices.

Various other analog line multiplexing schemes can be utilized. For example, the first analog line of each port can be connected in common to one input of an eight-input multiplexer. The second analog lines of each port can similarly be connected together and coupled to a second input of the multiplexer. The other six analog lines of the four ports can be similarly connected to the multiplexer. With eight multiplexer inputs, a 3-bit word can be used to select which one of the eight analog lines is to be coupled to the ADC, or to other analog FIG. 10 illustrates a mixed signal integrated circuit employing the manner in which I/O pins can be configured to operate with either digital signals or analog signals, and particularly how each pin interface circuit can be configured to couple analog signals either to the pin interface circuits, or from the pin interface circuits. The pin interface circuits, such as pin interface circuit 714, can be constructed in the manner described above. Each pin interface circuit includes digital input and output lines 1010, coupled to corresponding digital circuits (not shown). Coupled to each pin interface circuit is a digital/analog selector 1012 for selecting whether the respective pin interface circuits are to be configured for analog or digital operation. The digital/analog selector 1012 is registered and can be programmed on the fly by the processor 718. The processor 718 is preferably of the type having a serial port 1014 for programming by a user via an I/O pin interface circuit 1015.

The processor 718 has a data bus 1016 coupled to the digital/analog selector 1012, as well as to an I/O driver configuration circuit 1018. The I/O driver configuration circuit 1018 functions to provide the bidirectional coupling of different analog signals between one or more ADC devices, or one or more DAC devices, and the I/O pin interfaces. The I/O driver configuration circuit 1018 is coupled to an analog mux/demux 1020 by way of bus 1019. The coupling of analog signals between the pin interface circuits is accomplished by the use of the analog multiplexer/demultiplexer 1020. A pair of ADC devices 1024 and 1026 are utilized for coupling converted analog signals from the analog mux/demux 1020 to the processor 718 by way of a data bus 1032. A pair of DAC devices 1028 and 1030 functions to convert digital signals output by the processor 718 on bus 1032 to corresponding analog signals. The analog signals output by the DAC devices 1028 and 1030 are coupled through the analog mux/demux 1020 to the selected line(s) 1022 to the respective pin interface circuits.

The advantage of the embodiment illustrated in FIG. 10 is that any one of the pin interface circuits can carry digital signals to and/or from the digital circuits, but any of the pin interface circuits can also be configured to carry analog signals to and/or from the analog circuits. Importantly, any one of the pin interface circuits can be enabled to carry analog signals from the analog mux/demux 1020 thereto, or enabled to carry analog signals from the respective pin interface circuits to the analog mux/demux 1020.

In operation, when it is desired to output a digital signal to one or more of the pin interface circuits, the processor writes the digital/analog selector 1012 to place the respective pin interface circuits in a digital mode of operation. Then, the digital signals generated by other circuits (not shown) are enabled to transfer the digital signals to the pin interface circuits. The pin interface circuits can also be enabled to receive externally-generated digital signals and transfer the same to on-board digital circuits.

When it is desired to transfer analog signals to respective pin interface circuits, the processor 718 writes the digital/analog selector 1012 to enable the analog circuits in the respective pin interface circuits. The processor 718 also writes the I/O driver configuration circuit 1018 to select the appropriate line 1022 to be active between the analog mux/demux 1020 and the respective pin interface. The processor 718 then generates a digital word and transfers the same on bus 1032 to the DAC devise(s). The processor 718 enables one or both of the DAC devices 1028 and/or 1030 to initiate the conversion process. Once the digital word has been converted to a corresponding analog voltage, the analog voltage is coupled through the analog mux/demux 1020 on the selected line 1022 to the respective pin interface circuit. While only DAC devices 1028 and 1030 are shown coupling on-board analog signals to the analog mux/demux 1020, other analog circuits can be utilized for coupling analog signals thereto without undergoing a conversion process.

When it desired to couple analog signals from one or more pin interface circuits to the ADC devices 1024 and/or 1026, the analog circuits in the pin interfaces are enabled via the digital/analog selector 1012. The pin interface circuit that is to receive the externally-generated analog voltage is coupled to the analog mux/demux 1020 by one of the lines 1022. That line is coupled through the mux/demux 1020 to one of the ADC devices 1024 or 1026. The connection through the mux/demux 1020 is established by the digital code placed on bus 1019 by the I/O driver configuration circuit 1018. As noted above, the I/O driver configuration circuit 1018 is programmable by the processor 718. The selected ADC device 1024 or 1026 is then enabled to initiate the conversion process in converting the analog voltage to a corresponding digital words. The digital words are coupled to the processor via the bus 1032.

It should be understood that various types of analog mux/demux devices 1020 can be utilized so that analog signals can be carried therethrough in both directions. Moreover, the mux/demux 1022 can be of the type where two or more analog signals can be switched therethrough in the same direction at the same time, depending on the need. Lastly, in some situations, it may not be necessary to couple each pin interface circuit to the analog mux/demux 1020 by an individual line 1022. Rather, some of the pin interface circuits can have their analog lines connected together, such as shown in FIG. 9, and the common analog line coupled to the analog mux/demux 1020. In this latter instance, only one pin interface in the group can be activated at one time to carry analog signals.

Figure 11:
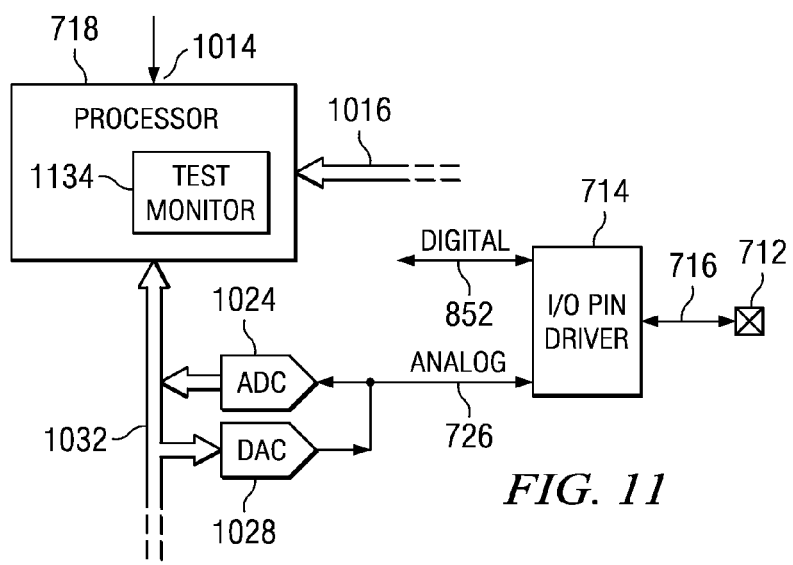
FIG. 11 illustrates in block diagram form a technique for providing a feedback of signals to an I/O pin interface circuit, and then back to a test monitor via an ADC.

FIG. 11 illustrates an arrangement where on-board generated signals coupled to the pin interface circuit 714 can be routed back to on-board analyzing circuits to verify the integrity of such signals. Here, digital signals can be coupled to the pin interface circuit 714 on line 852 in the manner described above. FIG. 8 illustrates the details of how the digital signals can then be coupled to the input of the ADC 1024 via the analog line 726. Of course, the analog transmission gate 866 must be enabled. In any event, the ADC device 1024 can convert the various voltage levels of the digital signal, including transients, to corresponding digital values for processing by the processor 718. The processor can be programmed to carry out an analysis of the integrity of the digital signals generated either internally on the chip or externally. The test monitor 1134 illustrates the programmed operations to carry out such analysis. Diagnostics of the various signals, including digital and analog signals, can be achieved to verify proper operation of the circuits generating the same. Indeed, analog signals output from the DAC 1028 can be coupled back to the ADC 1024, and the resulting digital signals coupled to the processor on bus 1032 for subsequent analysis. The test monitor 1134 of the processor 718 can provide different levels of alarms to indicate various problems found by the software 1134.

While the preferred and other embodiments of the invention have been disclosed with reference to a specific mixed signal processing circuit, and method of operation thereof, it is to be understood that many changes in detail may be made as a matter of engineering choices, without departing from the spirit and scope of the invention, as defined by the appended claims.

It will be appreciated by those skilled in the art having the benefit of this disclosure that this invention provides a SAR ADC with a reconfigurable ground sense pin. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A circuit, comprising:
    a successive approximation register A/D converter having a ground pin and a ground sense pin, wherein the ground pin is connected to a ground port of the circuit;
    a multiplexer for connecting the ground sense pin of the successive approximation register A/D converter to one of a plurality of I/O ports of the circuit; and
    a switch for selectively connecting the ground sense pin of the successive approximation register A/D converter to the ground port of the circuit.

2. The circuit of claim 1, wherein the multiplexer selects the one of the plurality of I/O ports of the circuit package responsive to a first control input from a first special function register.

3. The circuit of claim 1, wherein the switch selectively connects to the ground port responsive to a second control input from a second special function register.

4. The circuit of claim 1, wherein the switch disconnects the ground sense pin from the ground port and the multiplexer connects the ground sense pin to an unused one of the plurality of I/O ports of the circuit in a first mode of operation and further wherein the switch connects the ground sense pin to the ground port of the circuit in a second mode of operation.

5. A circuit, comprising:
    a successive approximation register A/D converter having a ground pin and a ground sense pin, wherein the ground pin is connected to a ground port of the circuit;
    a multiplexer for connecting the ground sense pin of the successive approximation register A/D converter to one of a plurality of I/O ports of the circuit, wherein the multiplexer selects the one of the plurality of I/O ports of the circuit responsive to a first control input from a first special function register;
    a switch for selectively connecting the ground sense pin of the successive approximation register A/D converter to the ground port of the circuit, wherein the switch selectively connects to the ground port responsive to a second control input from a second special function register; and
    wherein the switch disconnects the ground sense pin from the ground port and the multiplexer connects the ground sense pin to an unused one of the plurality of I/O ports of the circuit in a first mode of operation and further wherein the switch connects the ground sense pin to the ground port of the circuit package in a second mode of operation.

6. A method for controlling an output of a ground sense pin of a successive approximation register A/D converter in a circuit, comprising the steps of:
    determining whether any I/O ports of the circuit are available for use;
    if any I/O ports are available, disconnecting the ground sense pin of the successive approximation register A/D converter from a ground port and connecting an output of a multiplexer to an unused I/O port; and
    if no I/O ports are available, connecting the ground sense pin of the successive approximation register A/D converter to a ground port of the circuit.

7. The method of claim 6, wherein the step of connecting an output of the multiplexer further comprises the step of connecting an output of the multiplexer to an unused I/O port responsive to a first control input from a first special function register.

8. The method of claim 6, wherein the steps of connecting the ground sense pin of the successive approximation register A/D converter further includes the step of selectively connecting to the ground port responsive to a second control input from a second special function register.

9. A circuit, comprising:
    an electronic component having a ground pin and a ground sense pin, wherein the ground pin is connected to a ground port of the circuit;

a multiplexer for connecting the ground sense pin of the electronic component to one of a plurality of I/O ports of the circuit; and a switch for selectively connecting the ground sense pin of the electronic component to the ground port of the circuit.

10. The circuit of claim 9, wherein the multiplexer selects the one of the plurality of I/O ports of the circuit responsive to a first control input from a first register.

11. The circuit of claim 9, wherein the switch selectively connects to the ground port responsive to a second control input from a second register.

12. The circuit of claim 9, wherein the switch disconnects the ground sense pin from the ground port and the multiplexer connects the ground sense pin to an unused one of the plurality of I/O ports of the circuit in a first mode of operation and further wherein the switch connects the ground sense pin to the ground port of the circuit in a second mode of operation.

13. A circuit, comprising:

an electronic component having a ground pin and a ground sense pin, wherein the ground pin is connected to a ground port of the circuit;

a multiplexer for connecting the ground sense pin of the electronic component to one of a plurality of I/O ports of the circuit;

a switch for selectively connecting the ground sense pin of the electronic component to the ground port of the circuit; and wherein the switch disconnects the ground sense pin from the ground port and the multiplexer connects the ground sense pin to an unused one of the plurality of I/O ports of the circuit in a first mode of operation and further wherein the switch connects the ground sense pin to the ground port of the circuit in a second mode of operation.

* * * * *